(12) United States Patent
Lindley

(10) Patent No.: US 9,673,077 B2
(45) Date of Patent: Jun. 6, 2017

(54) PEDESTAL CONSTRUCTION WITH LOW COEFFICIENT OF THERMAL EXPANSION TOP

(71) Applicant: Watlow Electric Manufacturing Company, St. Louis, MO (US)

(72) Inventor: Jacob R. Lindley, St. Louis, MO (US)

(73) Assignee: Watlow Electric Manufacturing Company, St. Louis, MO (US)

( * ) Notice: Subject to any disclaimer, the term of this patent is extended or adjusted under 35 U.S.C. 154(b) by 625 days.

(21) Appl. No.: 13/836,373

(22) Filed: Mar. 15, 2013

(65) Prior Publication Data

US 2014/0011153 A1    Jan. 9, 2014

Related U.S. Application Data

(63) Continuation-in-part of application No. 13/541,006, filed on Jul. 3, 2012, now Pat. No. 9,224,626.
(Continued)

(51) Int. Cl.

| H05B 3/00 | (2006.01) |
|---|---|
| H01L 21/683 | (2006.01) |
| H01L 21/67 | (2006.01) |
| H01L 21/687 | (2006.01) |
| H05B 3/26 | (2006.01) |

(52) U.S. Cl.
CPC ...... *H01L 21/683* (2013.01); *H01L 21/67103* (2013.01); *H01L 21/68785* (2013.01); *H01L 21/68792* (2013.01); *H05B 3/265* (2013.01); *H05B 2203/013* (2013.01);
(Continued)

(58) Field of Classification Search
CPC .............. H05B 3/265; H05B 2203/013; H05B 2203/017; H01L 21/67103; H01L 21/68785; H01L 21/68792; H01L 21/683; Y10T 29/53178; Y10T 29/53174; Y10T 29/5313; Y10T 29/53; Y10T 29/49002
USPC .......... 29/740, 739, 729, 700; 219/201, 540, 219/444.1, 385, 508, 520, 539; 165/61; 432/227

See application file for complete search history.

(56) References Cited

U.S. PATENT DOCUMENTS

| 3,710,251 A | 1/1973 | Hagge et al. |
|---|---|---|
| 5,794,838 A | 8/1998 | Ushikoshi et al. |

(Continued)

FOREIGN PATENT DOCUMENTS

| EP | 1156703 | 11/2001 |
|---|---|---|
| WO | 2009/149275 | 12/2009 |

OTHER PUBLICATIONS

International Search Report and Written Opinion for PCT/US2014/019544 dated Apr. 17, 2014.

*Primary Examiner* — Peter DungBa Vo
*Assistant Examiner* — Azm Parvez
(74) *Attorney, Agent, or Firm* — Burris Law, PLLC

(57) ABSTRACT

A support assembly for use in semiconductor processing includes an application substrate, a heater layer disposed directly onto the application substrate, an insulation layer disposed onto the heater layer, and a second substrate disposed onto the insulation layer. The heater layer is directly disposed onto the application substrate by a layered process such that the heater layer is in direct contact with the application substrate. The application substrate defines a material having a relatively low coefficient of thermal expansion that is matched to a coefficient of thermal expansion of the heater layer.

19 Claims, 7 Drawing Sheets

Related U.S. Application Data

(60) Provisional application No. 61/770,910, filed on Feb. 28, 2013.

(52) U.S. Cl.
CPC ... *H05B 2203/017* (2013.01); *Y10T 29/49002* (2015.01); *Y10T 29/53178* (2015.01)

(56) References Cited

U.S. PATENT DOCUMENTS

| | | |
|---|---|---|
| 6,310,755 B1 | 10/2001 | Kholodenko et al. |
| 6,328,096 B1 | 12/2001 | Stone et al. |
| 6,391,437 B1 | 5/2002 | Kadomura et al. |
| 6,436,545 B1 | 8/2002 | Tanahashi et al. |
| 6,448,538 B1 | 9/2002 | Miyata |
| 6,462,928 B1 | 10/2002 | Shamouilian et al. |
| 6,464,790 B1 | 10/2002 | Sherstinsky et al. |
| 6,464,795 B1 | 10/2002 | Sherstinsky et al. |
| 6,490,146 B2 | 12/2002 | Wang et al. |
| 6,503,368 B1 | 1/2003 | Kholodenko et al. |
| 6,508,062 B2 | 1/2003 | Flanigan et al. |
| 6,511,759 B1 | 1/2003 | Schalansky et al. |
| 6,535,371 B1 | 3/2003 | Kayamoto et al. |
| 6,538,872 B1 | 3/2003 | Wang |
| 6,583,638 B2 | 6/2003 | Costello et al. |
| 6,583,980 B1 | 6/2003 | Wang et al. |
| 6,605,955 B1 | 8/2003 | Costello et al. |
| 6,646,233 B2 | 11/2003 | Kanno et al. |
| 6,687,113 B2 | 2/2004 | Saito et al. |
| 6,717,115 B1 | 4/2004 | Pfahnl et al. |
| 6,853,533 B2 | 2/2005 | Parkhe et al. |
| 6,875,927 B2 | 4/2005 | Brown et al. |
| 6,907,924 B2 | 6/2005 | Moslehi et al. |
| 7,044,399 B2 * | 5/2006 | Goto ............ C23C 16/4581 219/443.1 |
| 7,138,606 B2 | 11/2006 | Kanno et al. |
| 7,337,745 B1 | 3/2008 | Komino et al. |
| 7,353,979 B2 | 4/2008 | Fujii et al. |
| 7,361,869 B2 | 4/2008 | Russegger |
| 7,667,475 B2 | 2/2010 | Steps et al. |
| 7,667,944 B2 | 2/2010 | Naim et al. |
| 7,705,275 B2 * | 4/2010 | Umotoy ........ C23C 16/45521 156/345.48 |
| 7,709,099 B2 | 5/2010 | Yokoyama |
| 7,800,021 B2 * | 9/2010 | Pilavdzic ........ C23C 28/321 219/212 |
| 7,855,569 B2 | 12/2010 | Natsuhara et al. |
| 2002/0023914 A1 | 2/2002 | Kitagawa |
| 2004/0154647 A1 | 8/2004 | Sheydayi et al. |
| 2004/0206746 A1 | 10/2004 | Zhou |
| 2005/0082274 A1 | 4/2005 | Kondou |
| 2006/0144516 A1 * | 7/2006 | Ricci ............ H01L 21/67103 156/345.27 |
| 2007/0039944 A1 | 2/2007 | Okajima |
| 2007/0138601 A1 | 6/2007 | Fan et al. |
| 2008/0029195 A1 | 2/2008 | Lu |
| 2008/0138645 A1 | 6/2008 | Kawajiri et al. |
| 2009/0002913 A1 | 1/2009 | Naim |
| 2009/0050621 A1 | 2/2009 | Awazu et al. |
| 2009/0242101 A1 | 10/2009 | Hattori et al. |
| 2009/0305489 A1 | 12/2009 | Fish |
| 2010/0219509 A1 * | 9/2010 | He ............ C30B 25/18 257/618 |

\* cited by examiner

PEDESTAL CONSTRUCTION WITH LOW COEFFICIENT OF THERMAL EXPANSION TOP

CROSS-REFERENCE TO RELATED APPLICATIONS

The present application claims the benefit of Provisional Application No. 61/770,910, filed on Feb. 28, 2013 and also claims the benefit of and is a continuation-in-part application of U.S. application Ser. No. 13/541,006, filed on Jul. 3, 2012, the content of which is incorporated herein by reference in its entirety.

FIELD

The present disclosure relates to semiconductor processing apparatuses, and more specifically to a pedestal disposed in a semiconductor chamber for supporting a wafer.

BACKGROUND

The statements in this section merely provide background information related to the present disclosure and may not constitute prior art.

A layered heater typically includes a plurality of functional layers applied on a substrate by layered processes. The plurality of functional layers may include a dielectric layer on the substrate, a resistive heating layer on the dielectric layer, and a protective layer on the resistive heating layer. The materials for the different functional layers and the substrate are carefully chosen to have compatible coefficient of thermal expansion (CTE) to reduce shear stress generated at the joining interfaces at elevated temperatures. The shear stress may cause generation of cracks or delamination at the joining interfaces, resulting in heater failure.

Only a limited number of materials can be used to form the different functional layers by a specific layered process, thereby limiting the selection of materials for the substrate, which should have a CTE matching the CTE of the dielectric layer applied on the substrate or matching the CTE of the heating layer. For example, when alumina ceramic is used to form the dielectric layer, titanium or molybdenum is generally used to form the substrate due to its chemical and CTE compatibility with the alumina ceramic.

The layered heater may need to be joined to a heating target in some applications. For example, the layered heater may be joined to an electrostatic chuck to form a heated electrostatic chuck. However, the limited selection of materials for the substrate makes joining the layered heater to the electrostatic chuck difficult. When the substrate of the layered heater has a CTE that does not match the CTE of the chuck body, the heated electrostatic chuck is likely to fail due to generation of cracks or delamination at the joining interface at elevated temperatures.

Moreover, the heated electrostatic chuck may be bonded to a top of a pedestal layered heater so that the heated electrostatic chuck is disposed at a predetermined height inside a processing chamber. The pedestal is typically made of a metallic material, and is bonded to the substrate of the layered heater, which may be formed of a ceramic material. Similarly, a limited number of materials can be used to form the pedestal due to the compatibility of the metallic materials with the ceramic material.

The limited number of metals may include, for example, molybdenum, titanium, aluminum-silicon alloys and others. Using these materials to form the pedestal may increase manufacturing costs due to difficulty in manufacturing and machining. Moreover, the metal pedestal, which is exposed to processing gases in the processing chamber, may contaminate the wafer to be processed, if the exposed surface of the metal pedestal is not properly treated.

SUMMARY

In one form, a support assembly for use in semiconductor processing includes an application substrate, a heater layer disposed directly onto the application substrate, an insulation layer disposed onto the heater layer, and a second substrate disposed onto the insulation layer. The heater layer is disposed directly onto the application substrate by a layered process such that the heater layer is in direct contact with the application substrate. The application substrate defines a material having a relatively low coefficient of thermal expansion that is matched to a coefficient of thermal expansion of the heater layer. The application substrate may be an aluminum-silicon alloy.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

In order that the invention may be well understood, there will now be described an embodiment thereof, given by way of example, reference being made to the accompanying drawing, in which.

Corresponding reference numerals indicate corresponding parts throughout the several views of the drawings.

DETAILED DESCRIPTION

The following description is merely exemplary in nature and is not intended to limit the present disclosure, application, or uses.

Figure 1:
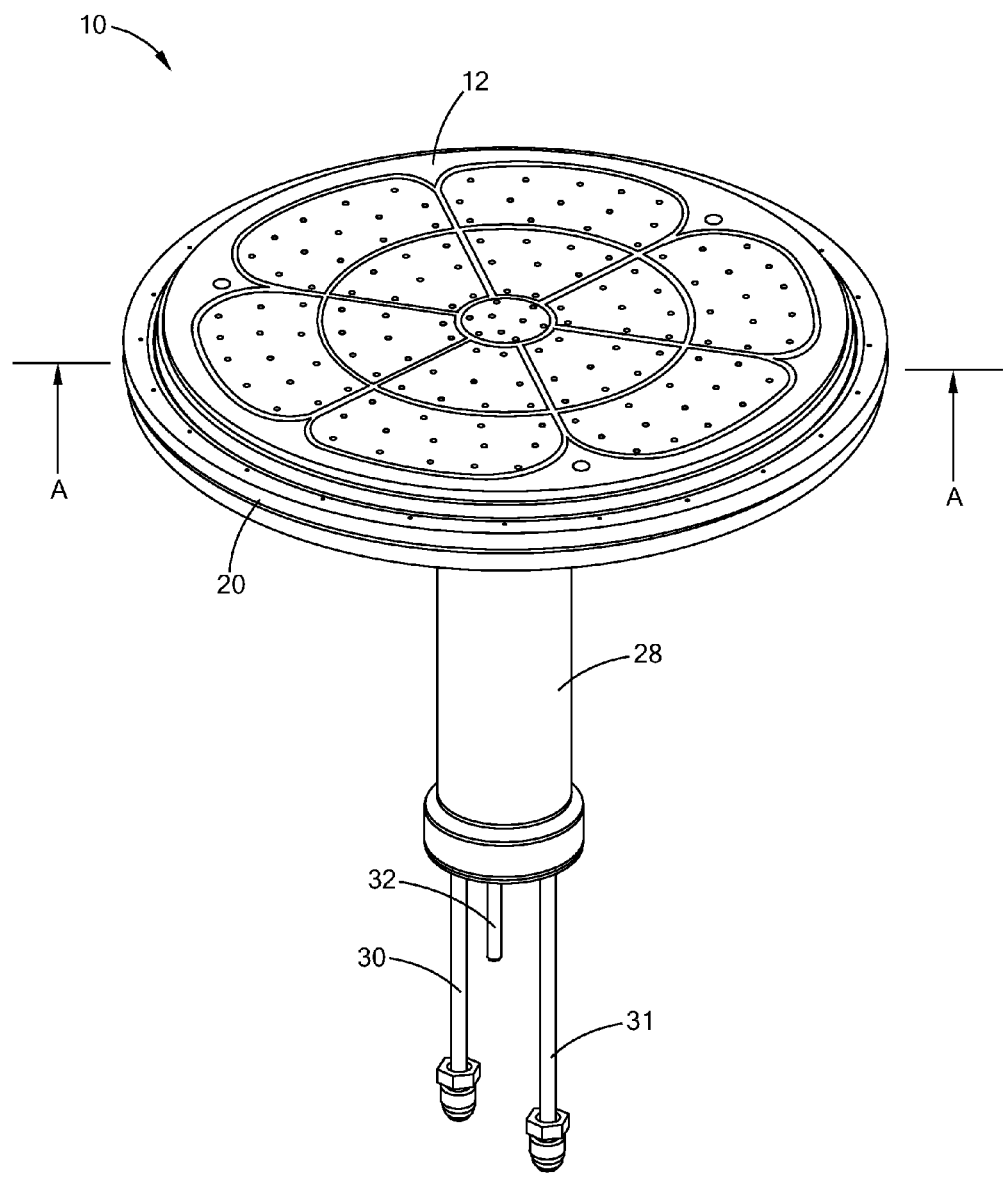
FIG. 1 is a perspective view of a support assembly constructed in accordance with the teachings of the present disclosure.
Figure 2:
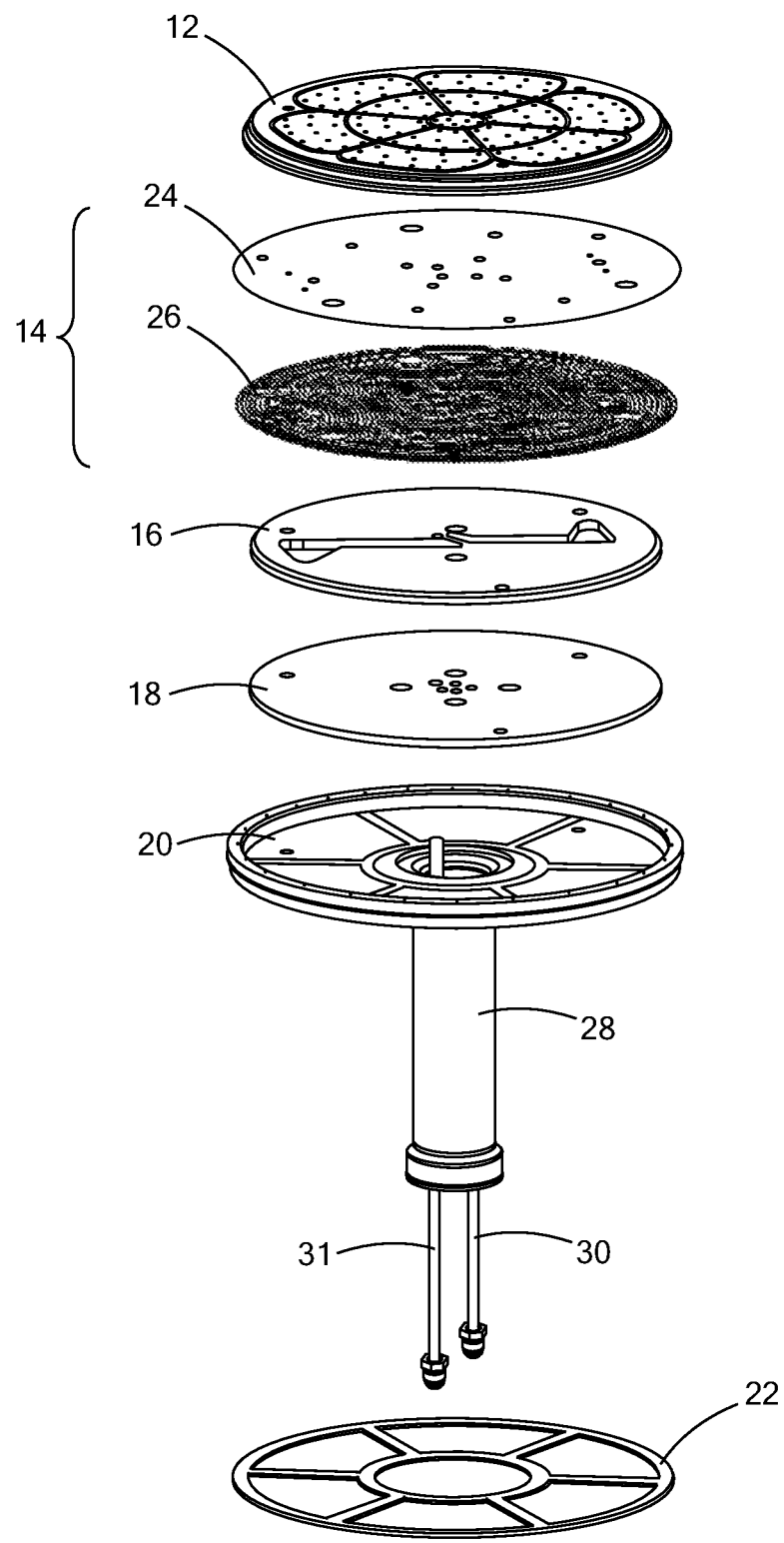
FIG. 2 is a partial exploded view of a support assembly constructed in accordance with the teachings of the present disclosure.
Figure 3:
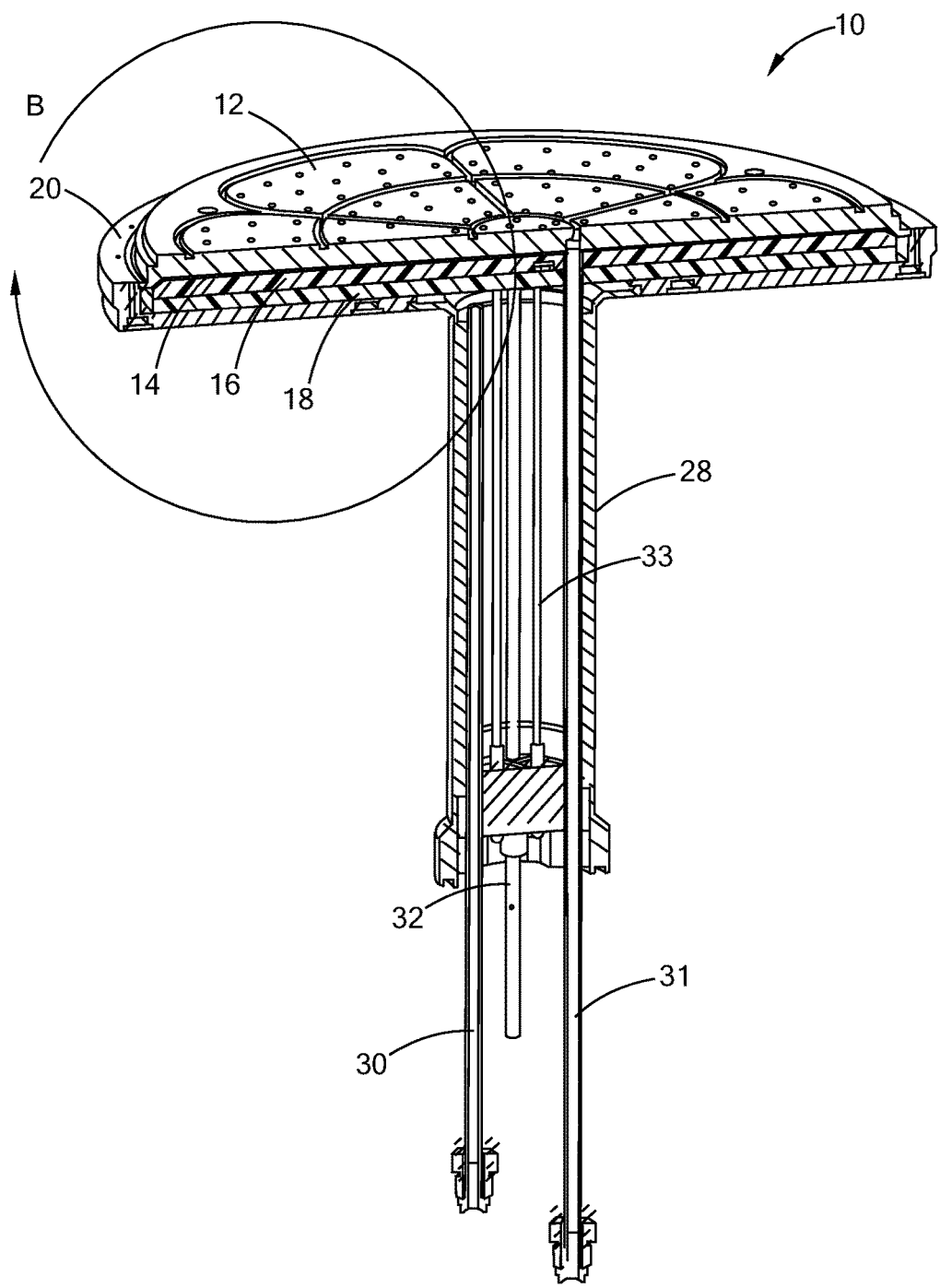
FIG. 3 is a perspective, cross-sectional view of a support assembly constructed in accordance with the teachings of the present disclosure and taken along line A-A of FIG. 1.

Referring to FIGS. 1 to 3, a support assembly 10 constructed in accordance with the teachings of the present disclosure is used in semiconductor processing. The support assembly 10 includes an application substrate 12, a heater layer 14, a first insulation layer 16, a second insulation layer 18, a second substrate 20, and a bottom cover 22 arranged in this order from top to bottom. The heater layer 14 includes a dielectric layer 24 and a resistive layer 26. A tubular pedestal structure 28 is secured to the second substrate 20. The second substrate 20 may be a functional substrate that is configured to provide a particular function depending on applications. For example, the second substrate 20 may be a gas-distributing substrate to provide purge gas or a cooling substrate for providing a cooling gas to cool the application substrate 12. The second substrate 20 may also be a temperature adjusting substrate that adjusts the temperature of the application substrate by any conventional means or by heating or cooing. When used as a gas-distributing substrate or a cooling substrate, the second substrate 12 may define a space for receiving gas conduits.

A gas conduit 30 may be received in the tubular pedestal structure 28 to provide purge gas to the second substrate 20. A vacuum conduit 31 is also received in the tubular pedestal structure 28 and connects to the application substrate 12 to provide vacuum clamping of the wafer. A temperature sensor 32 is also received in the tubular pedestal structure 28 and connects to the application substrate. Electric wires 33 (shown in FIG. 3) are also received in the tubular pedestal 28 and provide electrical power to the resistive layer 26. The first and second insulation layers 16 and 18 may include mica.

Figure 4:
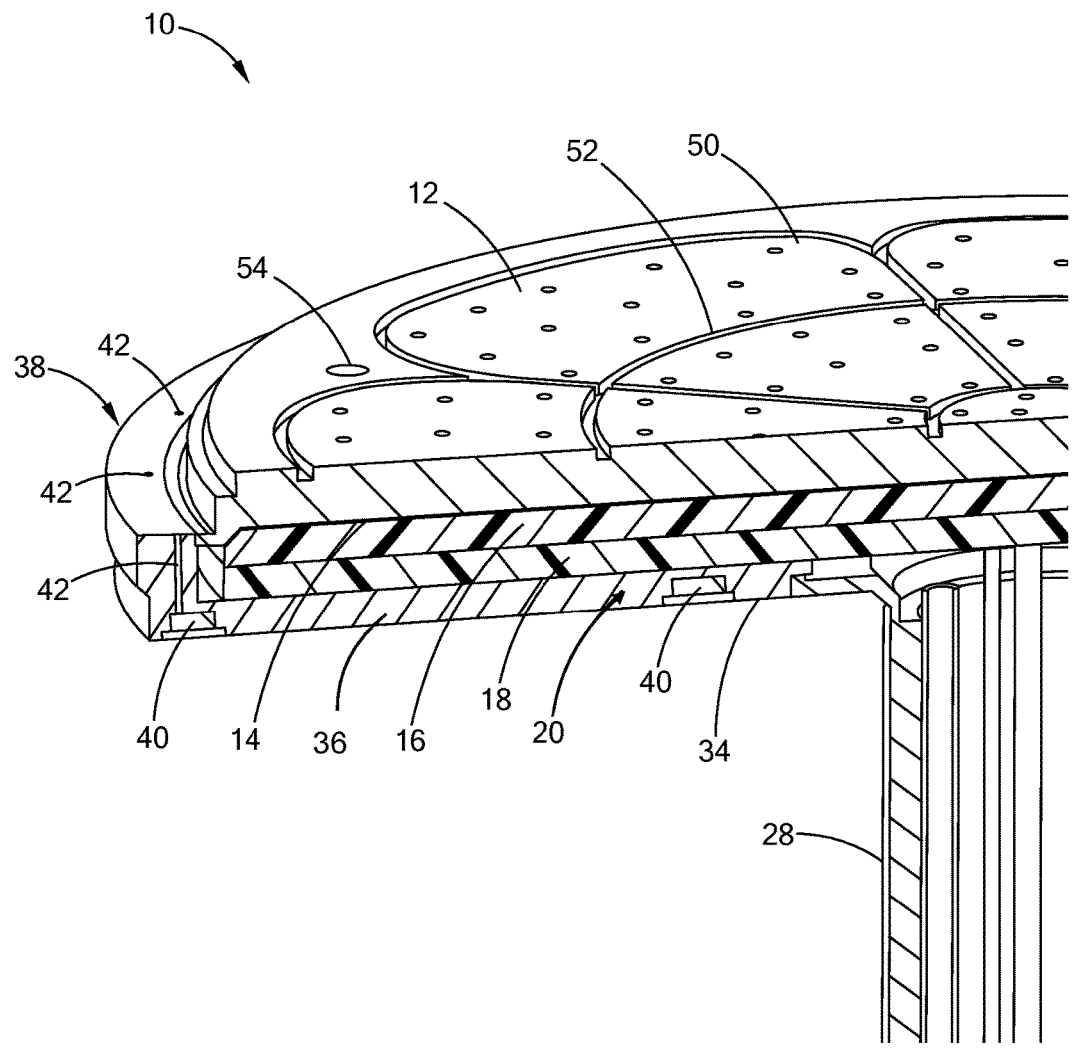
FIG. 4 is an enlarge view of portion B of FIG. 3.

Referring to FIG. 4, the tubular pedestal structure 28 is secured to a bottom surface 34 of the second substrate 20. The tubular pedestal structure 28 and the second substrate 20 may be made of aluminum or steel. The second substrate 20 defines a substantially cup shape and includes a base portion 36 and a peripheral portion 38 extending vertically from the base portion 36 and along the outer periphery of the base portion 36. The base portion 36 defines a plurality of purge gas distribution channels 40. The peripheral portion 38 defines a plurality of outlet holes 42.

Figure 5:
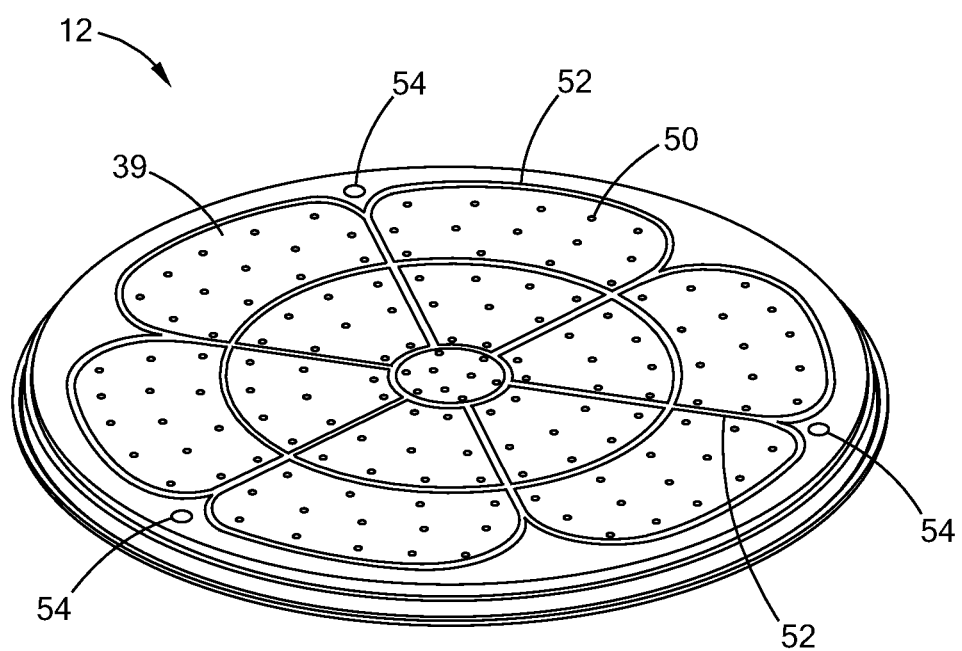
FIG. 5 is a perspective view of an application substrate of a support assembly constructed in accordance with the teachings of the present disclosure.

Referring to FIG. 5, the application substrate 12 is to be bonded to a heating target, such as a substrate of an electrostatic chuck to form a heated electrostatic chuck, for semiconductor processing. The application substrate 12 defines a plurality of vacuum clamping channels 50. The application substrate 12 further defines lift pin holes 54 (three are shown in FIG. 5) for receiving proximity pins (not shown) so that the application substrate 12 can be properly positioned in place. The vacuum clamping channels 50 and proximity pins facilitate vacuum clamping of the wafer. The proximity pins reduce the contact area between the wafer and application substrate 12, which reduces particulation due to friction and improves the thermal control of the wafer. The lift pin holes 54 provide clearance for proximity pins (not shown) to pass through the support assembly 10 to place the wafer onto the application substrate 12.

The application substrate 12 is made of a material that has a relatively low coefficient of thermal expansion matched to a CTE of the heater layer 14 and matched to a CTE of the substrate to be bonded thereon. As an example, the heater layer 14, when formed by thermal spray, may have a CTE about 7 μm/mK. The application substrate 12 may have a CTE in the range of 5 to 8 μm/mK. The application substrate 12 may be made of Osprey™ Controlled Expansion (CE) alloy, which is an aluminum silicon alloy. The Osprey™ Controlled Expansion (CE) alloy provides a tailored CTE by changing the compositions of the aluminum silicon alloy. When the silicon in the alloy is from 30 to 70% by weight, the CTE ranges from 17 to 7 ppm/° C.

Alternatively, the materials of the application substrate 12 may be selected based on the materials to be attached to the application substrate 12. The suitable materials for the application substrate 12 may include aluminum matrix materials containing ceramic particles such as silicon (Si), silicon carbide (SiC), aluminum oxides ($Al_2O_3$). Low-expansion metals, such as titanium, molybdenum, niobium, or sintered ceramics, such as aluminum oxides (Al2O3), aluminum nitride (AlN) may be used. When metallic materials are used to form the application substrate 12, a chemically isolating layer 39 is provided on top of the application substrate 12 to avoid contamination to the wafer to be processed. The chemically isolating layer 39 may be a thermally-sprayed ceramic material, a thin-film deposited ceramic material, a conversion coating, or an adhesively bonded sintered ceramic component.

The application substrate 12 can serve as a substrate on which a heater layer 14 is formed. The application substrate 12 also serves as an application interface to be bonded to a heating target/substrate. To form the heater layer 14 on the application substrate 12, the heater layer 14 may be formed directly on the application substrate by a layered process, such as thick film, thin film, thermal spray and sol-gel. For example, a dielectric layer 24 may be first formed on the application substrate 12 by thermally-spraying a dielectric material, followed by thermally-spraying a resistive material on the dielectric layer 24 to form the resistive layer 26.

To form the heating target on the application substrate 12, the heating target may be secured to the application substrate 12 by metal inert gas welding (MIG), tungsten inert gas welding (TIG), laser welding, electron beam welding, brazing, diffusion bonding or adhesive bonding.

Figure 6:
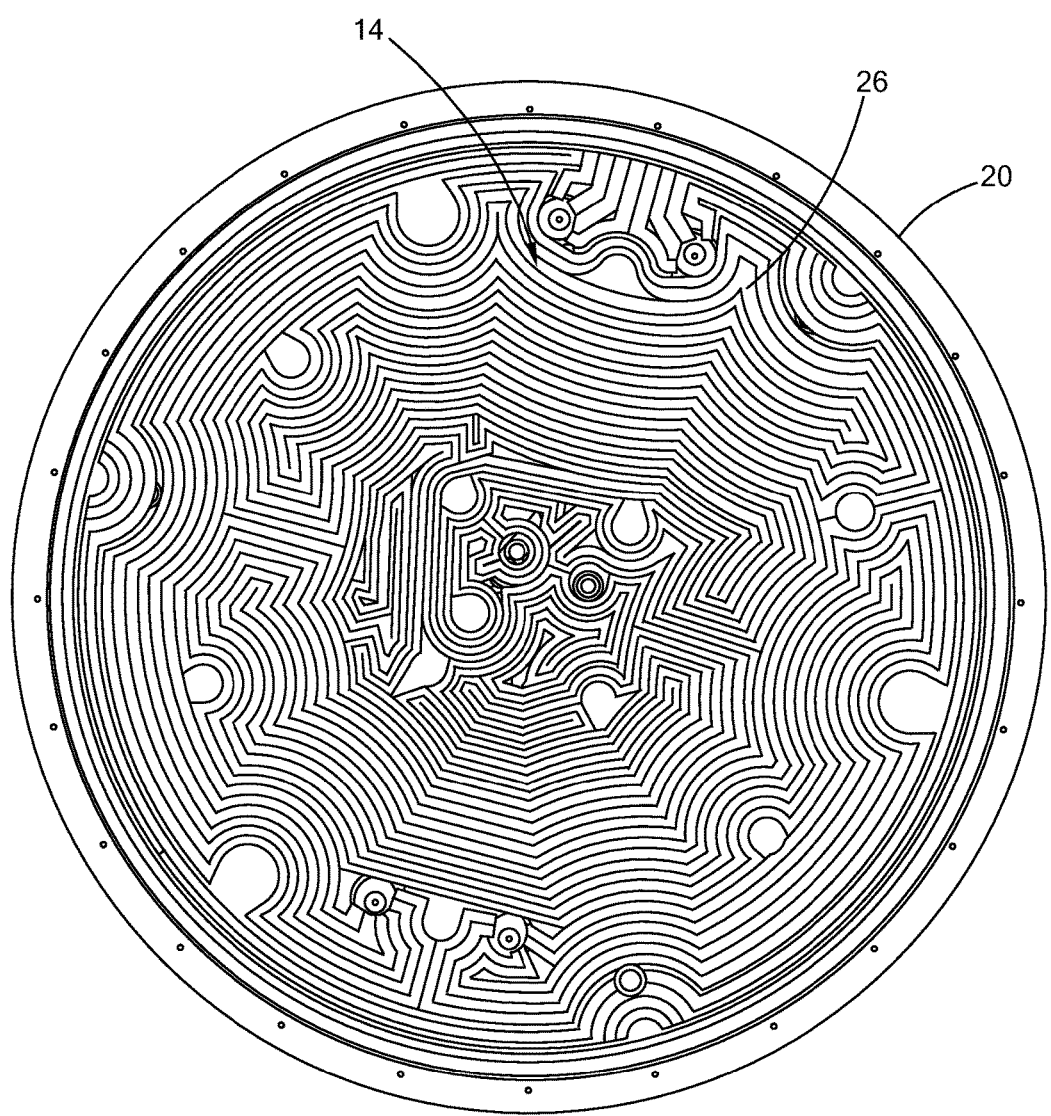
FIG. 6 is a top view of a support assembly constructed in accordance with the teachings of the present disclosure, where an application substrate is removed to show a resistive layer.

As shown in FIG. 6, the resistive layer 26 includes resistive circuit patterns for heating the application substrate 12 and hence the heating target bonded thereon. The heating target can be bonded to a side of the application substrate 12 before or after the heater layer 14 is formed on the opposite side of the application substrate 12.

Figure 7:
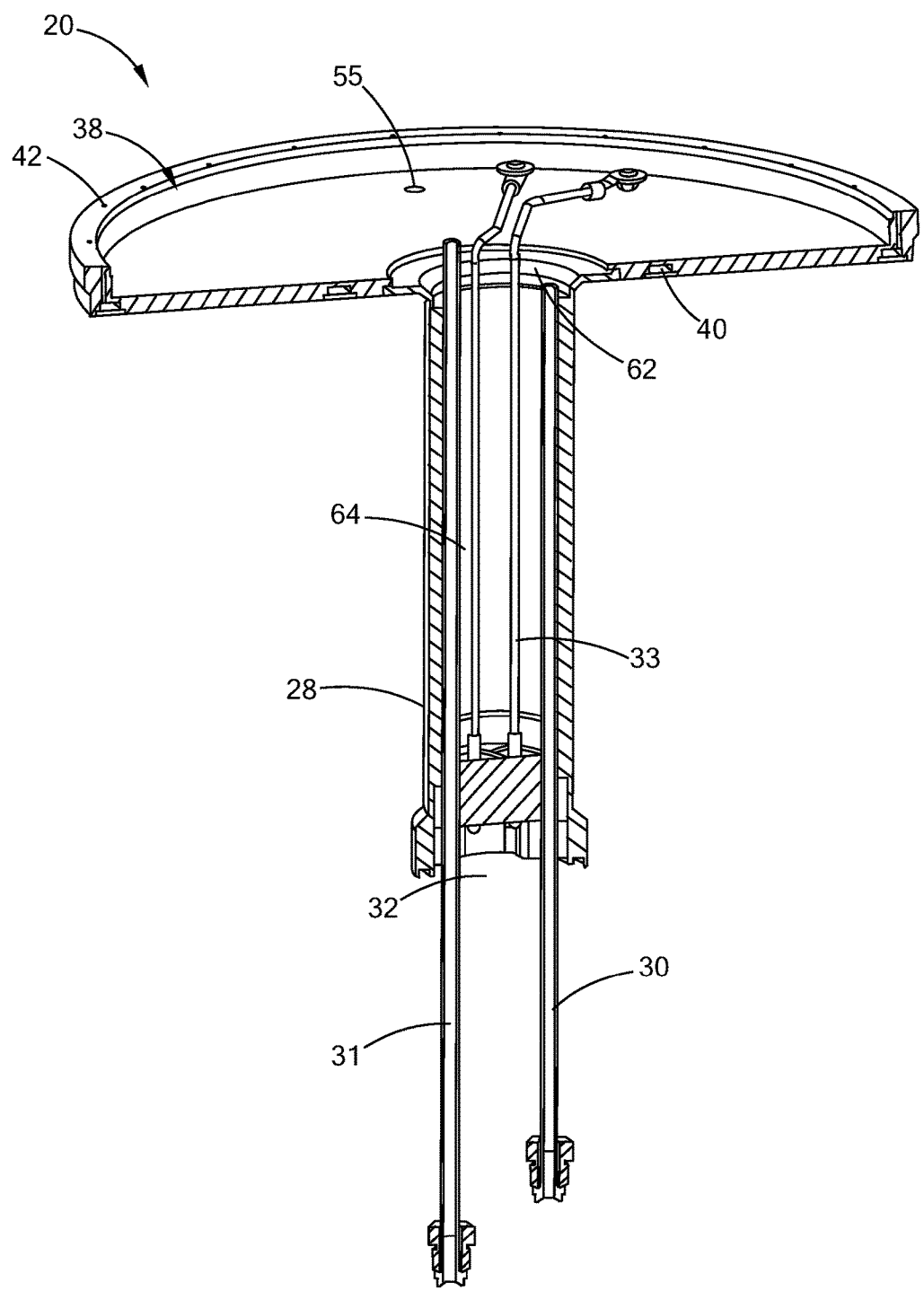
FIG. 7 is a perspective, cross-sectional view of a support assembly, where the structure above a cooling substrate is removed to show the cooling substrate.

Referring to FIG. 7, the second substrate 20 includes a plurality lift pin holes 55 corresponding to the lift pin holes 54 of the application substrate 12 to provide clearance for lift pins to extend vertically through the support assembly 10 to position the wafer onto the application substrate 12.

As shown, the base portion 36 of the second substrate 20 defines a central opening 62 in communication with a chamber 64 of the tubular pedestal structure 28. Therefore, the electric wires 33, gas conduit 30, and vacuum conduit 31 (and temperature sensor 32 not shown) can extend to top of the base portion 36 of the second substrate 20 to provide electric power to the heater layer 14, to provide gases to the purge gas distribution channels 40, and to produce a vacuum in the vacuum clamping channels 50 of the application substrate 12.

The resistive layer 26 includes circuit patterns depending on applications and may be formed on the dielectric layer 24 by a layered process such as a thermal spray, thick film, thin film and sol-gel.

The application substrate 12 is made of a low CTE material. Therefore, a semiconductor processing device, such as a layered heater, an electrostatic chuck, or a ceramic heater, which generally has a low-CTE substrate, can be bonded directly to the application substrate 12, making it relatively easy or less expensive to manufacture. The heater or an electrostatic chuck can be bonded to the underside, the top side, or both sides of the application substrate 12. The heater or electrostatic chuck can be bonded to the application substrate 12 by, for example, MIG, TIG, laser, and electron beam welding, brazing, diffusion bonding, and adhering.

The heater can be more closely coupled to the wafer. Therefore, the entire support assembly 10 can be manufactured with reduced costs and with improved performance, such as improved responsiveness, heater tenability and reliability.

Moreover, the application substrate 12 can function as a chemical and physical barrier between the wafer to be processed and the metal pedestal structure. Therefore, contamination to the bottom of the wafer by the pedestal can be avoided. A lower-cost metal can be used to form the tubular pedestal structure. Further, intensive structural features, such as edge purge distribution channels 40 can be formed in the peripheral portion 38 of the second substrate 20. Structural features can be machined in common metal components, such as aluminum, stainless steel. Therefore, the manufacturing costs can be further reduced.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A support assembly for use in semiconductor processing comprising:
    an application substrate;
    a heater layer disposed directly onto the application substrate by a layered process selected from a group consisting of thick film, thin film, thermal spray and sol-gel processes such that the heater layer is in direct contact with the application substrate;
    an insulation layer disposed onto the heater layer; and
    a second substrate disposed onto the insulation layer, the second substrate including a base portion and a peripheral portion surrounding the base portion and extending vertically and upwardly from the base portion,
    wherein the application substrate defines a material having a relatively low coefficient of thermal expansion that is matched to a coefficient of thermal expansion of the heater layer, the application substrate functioning as an interface to be bonded to a heating substrate by a thermal process, and
    wherein a top surface of the peripheral portion of the second substrate is lower than a top surface of the application substrate and is exposed from the top surface of the application substrate such that a step is defined between the top surface of the application substrate and the top surface of the peripheral portion of the second substrate.

2. The support assembly according to claim 1, wherein the application substrate is an aluminum-silicon alloy.

3. The support assembly according to claim 1, wherein the application substrate defines an upper surface onto which the heating substrate is placed during processing, the upper surface having a chemically isolating layer between the application substrate and the heating substrate.

4. The support assembly according to claim 3, wherein the chemically isolating layer is selected from the group consisting of a thermally sprayed ceramic material, a thin film deposited ceramic material, a conversion coating, and an adhesively bonded sintered ceramic component.

5. The support assembly according to claim 1, wherein the thermal bonding process is selected from the group consisting of MIG, TIG, laser, electron beam welding, brazing, diffusion bonding, and adhesive bonding.

6. The support assembly according to claim 1, wherein the application substrate defines an Osprey™ Controlled Expansion (CE) alloy.

7. The support assembly according to claim 6, wherein the application substrate has a variable composition such that the coefficient of thermal expansion of the application substrate matches that of the heater layer.

8. The support assembly according to claim 1, wherein the application substrate includes a chemically isolating layer.

9. The support assembly according to claim 1, wherein the application substrate includes a metallic layer and a chemically isolating layer on the metallic layer.

10. The support assembly according to claim 1, wherein the second substrate is a gas-distributing substrate for providing a purging gas.

11. The support assembly according to claim 1, wherein the second substrate is a cooling substrate for cooling the application substrate.

12. The support assembly according to claim 1, further comprising a pedestal connected to the second substrate.

13. The support assembly according to claim 12, further comprising a gas conduit received in the pedestal to provide purge gas to the second substrate.

14. The support assembly according to claim 12, further comprising a vacuum conduit received in the pedestal.

15. The support assembly according to claim 1, wherein the application substrate defines a plurality of vacuum clamping channels.

16. The support assembly according to claim 1, wherein the application substrate defines lift pin holes for receiving proximity pins.

17. The support assembly according to claim 16, wherein the proximity pins are movable to support a wafer and to place the wafer on the application substrate.

18. A support assembly for use in semiconductor processing comprising:
    a tubular pedestal;
    a gas-distributing substrate connected to the tubular pedestal, the gas-distributing substrate including a base portion and a peripheral portion surrounding the base portion and extending vertically and upwardly from the base portion;
    a heater layer provided on the gas-distributing substrate by a layered process selected from a group consisting of thick film, thin film, thermal spray, and sol-gel processes for heating a wafer; and
    an application substrate disposed on the heater layer and including an Osprey™ Controlled Expansion (CE) alloy that has a variable composition with a coefficient of thermal expansion compatible with that of the heater layer, the application substrate functioning as an interface to be bonded to a heating substrate by a thermal process,
    wherein a top surface of the peripheral portion of the gas-distributing substrate is lower than a top surface of the application substrate and is exposed from the top surface of the application substrate such that a step is defined between the top surface of the application substrate and the top surface of the peripheral portion of the gas-distributing substrate.

19. The support assembly according to claim 18, further comprising a gas conduit received in the pedestal for supplying a purge gas to the gas-distributing substrate.

* * * * *